(12) United States Patent
Pai (10) Patent No.: US 9,112,472 B2
(45) Date of Patent: Aug. 18, 2015

(54) VARIABLE GAIN LOW-NOISE AMPLIFIER

(71) Applicant: MStar Semiconductor, Inc., Hsinchu Hsien (TW)

(72) Inventor: Hung-Chuan Pai, Irvine, CA (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 64 days.

(21) Appl. No.: 14/107,463

(22) Filed: Dec. 16, 2013

(65) Prior Publication Data

US 2015/0171814 A1    Jun. 18, 2015

(51) Int. Cl.
| | |
|---|---|
| *H04B 1/06* | (2006.01) |
| *H04B 7/00* | (2006.01) |
| *H03G 3/30* | (2006.01) |
| *H04B 1/16* | (2006.01) |
| *H03F 3/193* | (2006.01) |
| *H03F 1/26* | (2006.01) |

(52) U.S. Cl.
CPC ............... *H03G 3/3042* (2013.01); *H03F 1/26* (2013.01); *H03F 3/193* (2013.01); *H04B 1/16* (2013.01); *H03F 2200/294* (2013.01); *H03F 2200/451* (2013.01)

(58) Field of Classification Search
CPC ......... H03G 3/3052; H03G 3/22; H03G 3/26; H03G 3/3068; H03G 3/3078; H04B 1/28; H04B 1/30; H04B 1/18; H03F 3/45085; H03F 3/45071; H03F 3/45089
USPC ............. 455/230, 230.1, 234.1, 240.1, 241.1, 455/255–260, 313, 323, 333, 334; 375/345; 330/251, 252, 254, 259
See application file for complete search history.

(56) References Cited

U.S. PATENT DOCUMENTS

| | | | | |
|---|---|---|---|---|
| 7,187,907 | B2 * | 3/2007 | Widrow | 455/73 |
| 7,911,268 | B2 * | 3/2011 | Chang et al. | 330/10 |
| 8,340,623 | B2 * | 12/2012 | Lu et al. | 455/334 |
| 8,829,985 | B2 * | 9/2014 | Niitsu et al. | 327/563 |
| 8,975,961 | B2 * | 3/2015 | Joshi et al. | 330/254 |

OTHER PUBLICATIONS

Kim et al., "A 13-dB IIP3 Improved Low-Power CMOS RF Programmable Gain Amplifier Using Differential Circuit Transconductance Linearization for Various Terrestrial Mobile D-TV Applications", IEEE Journal of Solid-State Circuits, vol. 41, No. 4, Apr. 2006, pp. 945-953.
Lerstaveesin, et al., "A 48-860 MHz CMOS Low-IF Direct-Conversion DTV Tuner", IEEE Journal of Solid-State Circuits, vol. 43, No. 9, Sep. 2008, pp. 2013-2024.

* cited by examiner

*Primary Examiner* — Nhan Le (74) *Attorney, Agent, or Firm* — Edell, Shapiro & Finnan, LLC (57) ABSTRACT

A variable-gain low-noise amplifier (VG-LNA) accepts a single-ended input signal at an input port and provides a differential output signal at an output port. The VG-LNA includes amplifier stages that are commonly coupled to the input port, with subtrahend amplifier stages commonly coupled to a negative terminal of the output port and minuend amplifier stages commonly coupled to a positive terminal of the output port. A control circuit activates up to one of the subtrahend amplifier stages and one of the minuend amplifier stages as a differential set of amplifier stages that generates the differential output signal from the single-ended input signal.

20 Claims, 7 Drawing Sheets

VARIABLE GAIN LOW-NOISE AMPLIFIER

TECHNICAL FIELD

The present disclosure relates to low-noise amplifiers in radio-frequency communication apparatuses.

BACKGROUND

Low-noise amplifiers (LNAs) are among the first signal processing components in a radio-frequency (RF) receiver chain. Typically, the target information-bearing signals arriving at the input of an LNA are weak and corrupted by noise. A well-designed LNA boosts the signal power of the incoming signal while minimizing the production of amplifier-induced artifacts, e.g., amplifier-generated noise and distortion, in the amplified signal. Thus, in addition to characteristics of any good signal amplifier, e.g., linear gain, stability and impedance-matched over the operating bandwidth, a good LNA must also have a low noise figure (NF) and high intermodulation and compression points.

The front-end of the receiver chain is often connected to an unbalanced transmission line on which a ground-referenced signal is delivered, which presents an interface problem in those modern RF receivers that implement differential signaling. Differential signaling, where the target signal's amplitude is the potential difference between two time-varying signal components, offers several advantages, not the least of which is cancellation of common mode noise. A common solution to adapting a single-ended signaling system, such as an unbalanced transmission line, to a receiver employing differential signaling is to install a balanced-unbalanced transformer, commonly referred to as a "balun" at or near the interface. However, this solution not only increases the receiver's size, complexity and cost, but conventional baluns are band-limited. Consequently, when the receiver is expected to accept signals that span a wide spectral region, conventional implementations incorporate multiple baluns, each to accommodate a sub-band of the target spectrum. Traditional television tuners, for example, operate in the very-high frequency (VHF) television broadcast band, which, in the US, spans the RF frequencies between 54 and 216 MHz and the ultra-high frequency (UHF) television broadcast band, which spans 470 MHz-806 MHz. The input circuitry in such television tuners is often composed of separate circuits for VHF and UHF bands, each with its own balun, LNA and, often downconverter.

Variable-gain LNAs (VG-LNAs) are often deployed where variation in incoming signal strength is expected. For broad dynamic range, a VG-LNA must provide not only amplification, but attenuation as well. Maintaining a wide operational frequency band in such a VG-LNA presents challenges in that parasitic loading of many attenuator circuits limit the spectral range of the amplifier.

Ongoing development efforts in radio front-end technology seek robust designs for broadband LNA circuits that can be situated at the single-ended to differential signaling interface with minimal size and cost.

SUMMARY

In a variable-gain low-noise amplifier (VG-LNA), an input port comprises a signal terminal and a common terminal between which a radio-frequency (RF) single-ended input signal is accepted. An output port comprises a positive terminal and a negative terminal between which an RF differential output signal is provided. A plurality of amplifier stages is commonly coupled to the signal terminal of the input port. The amplifier stages include one plurality of amplifier stages (referred to as subtrahend amplifier stages as explained below) commonly coupled to the negative terminal of the output port and another plurality of amplifier stages (referred to herein as minuend amplifier stages) commonly coupled to the positive terminal of the output port. A control circuit that is electrically connected to the amplifier stages activates up to one of the subtrahend amplifier stages and one of the minuend amplifier stages as a differential set of amplifier stages that generates the differential output signal from the single-ended input signal.

DESCRIPTION OF EXAMPLE EMBODIMENTS

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments Additionally, mathematical expressions are contained herein and those principles conveyed thereby are to be taken as being thoroughly described therewith. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

The techniques described herein are directed to variable-gain LNAs in RF receivers that receive single-ended input signals, such as on an unbalanced transmission line or on a single conductor, and that produce differential output signals, such as on a balanced transmission line or differential conductor set. The examples described below are presented in a television receiver front-end context; however, the present invention is not so limited. Upon review of this disclosure and appreciation of the concepts disclosed herein, the ordinarily skilled artisan will recognize other amplifier contexts in which the present inventive concept is applicable. The scope of the present invention is intended to encompass all such alternative implementations.

Figure 1:
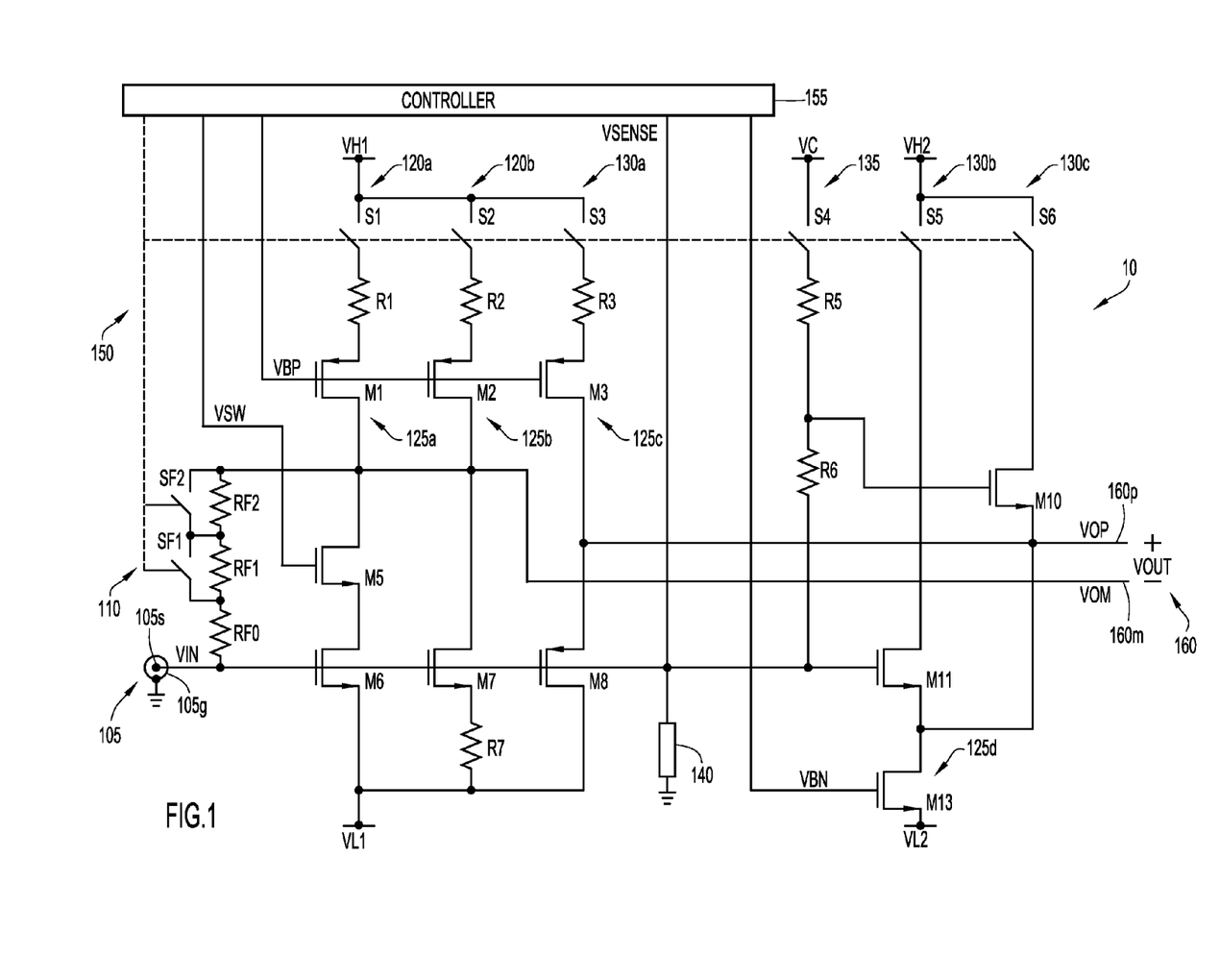
FIG. 1 is a schematic diagram of a variable-gain low-noise amplifier by which the present general inventive concept can be embodied.

FIG. 1 is a schematic diagram of a variable-gain low-noise amplifier (VG-LNA) 10 by which the present invention can be embodied. By way of example, VG-LNA 10 may be incorporated into a television receiver, either in the television itself or in a separate unit such as a set-top box, to amplify signals in the very-high frequency (VHF) and ultra-high frequency (UHF) television bands. Exemplary VG-LNA 10 is thus constructed to amplify signals in the frequency range between approximately 50 MHz and 900 MHz. An input port 105 may be installed to include a signal terminal 105s and a common terminal 105g between which an RF single-ended input signal VIN is accepted by VG-LNA 10. An output port 160 may also be installed to include a positive (plus) terminal 160p and a negative (minus) terminal 160m between which an RF differential output signal VOUT is provided from VG-LNA 10 to a target load circuit (not illustrated). VG-LNA 10 thus accepts a single-ended input signal VIN and produces therefrom a differential signal VOUT.

Differential output signal VOUT is formed from the difference between an output signal component VOP and an output signal component VOM. One might recall that in the arithmetic expression D=M−S, "D" is referred to as the "difference", "M" is referred to as the "minuend" and "S" is referred to as the "subtrahend." The differential output signal VOUT is the difference between output signal component VOP and output signal component VOM, i.e., VOUT=VOP−VOM. Thus, in accordance with aforementioned arithmetic conventions, the differential output signal VOUT is the difference between a minuend signal VOP and a subtrahend signal VOM. It is to be understood that this nomenclature is not intended to limit the present invention, but is used to explain the invention in a consistent and concise manner in light of the various configurations and signal characteristics of the illustrative embodiments.

Exemplary VG-LNA 10 is assembled from a plurality of amplifier stages including a plurality of subtrahend source amplifier stages 120a-120b, representatively referred to herein as subtrahend source amplifier stage(s) 120, and a plurality of minuend amplifier stages 130a-130c, representatively referred to herein as minuend amplifier stage(s) 130. The nomenclature "subtrahend" and "minuend" refer to the differential signal component that is produced by the corresponding amplifier stage 120 or 130. It is to be understood as well that while VG-LNA 10 is illustrated and described as being constructed from metal-oxide-semiconductor field-effect transistors (MOSFETs), the present invention is not so limited. Other transistor types may be used as the skilled artisan will readily appreciate upon review of this disclosure.

Exemplary VG-LNA 10 includes a control circuit, generally illustrated as control circuit 150, which may be constructed from a controller 155, configuration switches S1-S6, feedback resistance selection switches SF1-SF2 and a cutoff switch implemented by transistor M5, which will be referred to herein as cutoff switch M5. Controller 155 may be implemented in suitable circuitry to implement various monitoring and control functions, such as those described below. For example, controller 155 may be fabricated from analog circuits, digital circuits, or a combination of analog and digital circuits, as well as circuitry that interfaces analog signals to digital circuits, and vice-versa. Fixed and/or programmable logic may be included in controller 155 including, but not limited to field-programmable logic, application-specific integrated circuits, microcontrollers, microprocessors and digital signal processors. Embodiments of controller 155 may be fabricated to execute a process stored in a memory (not illustrated) as executable processor instructions. Controller 155 may be a portion of a broader control circuit that implements control over other functions of the receiver in which VG-LNA 10 is incorporated. Switches S1-S6 and SF1-SF2 may be implemented in RF switching devices suitable to the frequency range for which VG-LNA 10 is targeted.

A feedback circuit 110 is incorporated in exemplary VG-LNA 10 comprising one or more series-connected resistors RF0-RF2. The "feedback circuit" nomenclature is used for convenience; feedback circuit 130 need not function as such at all times. That is, the ultimate function realized by feedback circuit 130 at any given time is established by control circuit 150. Feedback circuit 110 is connected at one end to negative terminal 160m of output port 160 and at the opposite end to signal terminal 105s of input port 105. The drain terminals of cutoff switch M5 and transistor M7 are electrically short-circuited and are commonly connected to negative terminal 160m of output port 160. The gate terminals of transistors M6 and M7 are also electrically short-circuited and are commonly connected to signal terminal 105s of input port 105. Accordingly, subtrahend amplifier stages 120 are commonly connected to feedback circuit 110. As described in more detail below, control circuit 150 may activate or otherwise select up to one of the subtrahend amplifier stages 120, i.e., either, but not both of subtrahend amplifier stages 120 or neither of subtrahend amplifier stages 120, to provide output signal component VOM. The gain of an activated subtrahend amplifier stage 120 may be defined, at least in part, by the resistance established in feedback circuit 110, referred to herein as "feedback resistance RF." Control circuit 150 effectuates a particular resistance RF by compelling one or more of switches SF1 and SF2 into a conducting state, by which a corresponding feedback resistor RF1-RF2 is electrically bypassed, or into a non-conducting state, by which the corresponding feedback resistor RF1-RF2 adds to the total resistance RF. The skilled artisan will recognize variable resistance mechanisms other than that illustrated and described herein that can be incorporated into embodiments of the present invention without departing from the spirit and intended scope thereof.

In certain embodiments, the maximum resistance RF=RF0+RF1+RF2 is achieved when both switches SF1-SF2 are in their non-conducting states, is sufficiently large so as to block the input signal VIN along the signal path from terminal 105s of input port 105 to terminal 160m of output port 160 that passes through feedback circuit 110. In many cases, the large maximum resistance is a natural consequence of setting the value of RF to meet other design constraints such as maximum gain, input impedance, etc. However, it is to be understood that the present invention is not limited to a particular maximum resistance for RF or, for that matter, to a particular minimum resistance for RF, as will be understood and appreciated by those skilled in the electronic amplifier arts upon review of this disclosure.

Minuend amplifier stages 130 are also coupled to input port 105. As illustrated in FIG. 1, the gate terminals of transistors M8 and M11 are electrically short-circuited and commonly connected signal terminal 105s. The gate terminal of transistor M10 of minuend amplifier stage 130c is coupled to signal terminal 105s through a signal path that attenuates the input signal VIN, e.g., the signal path through resistor R6 of resistor circuit 135. Additionally, minuend amplifier stages 130 are commonly connected to the positive terminal 160p of output port 160.

Amplifier stages 120 and 130 each define a biasing current path from an upper supply voltage rail, e.g., VH1-VH2, to a lower supply voltage rail, e.g., VL1-VL2. As indicated in FIG. 1, upper supply voltage rails VH1 and VH2 need not be held at a common potential and the same is true for lower supply voltage rails VL1 and VL2. Moreover, the potential difference between an upper voltage rail VH1 and a corresponding lower voltage rail VL1 need not be the same as the potential difference between upper voltage rail VH2 and lower voltage rail VL2.

Current sources 125a-125d, representatively referred to herein as current source(s) 125, may be electrically interposed in the respective biasing current paths of amplifier stages 120 and 130 to provide biasing current. The level of biasing current provided by current sources 125 is established by a gate voltage; the biasing current from those current sources 125 that are based on a p-channel MOSFET, e.g., current sources 125a-125c, is proportional to the gate voltage VBP while the biasing current provided by current sources that are based on a n-channel MOSFET, e.g., current source 125d, is proportional to the gate voltage VBN. In the illustrated embodiment, VBP and VBN are controlled by control circuit 150, although the present invention is not so limited. Certain embodiments, for example, may have one or both of VBP and VBN provided by a power supply or a regulator circuit and are fixed to respective voltages. It is to be understood that the present invention is not limited to a particular biasing technique and those skilled in amplifier design will understand and appreciate the impact of a selected biasing mechanism on small signal gain, input and output impedances, etc., without such being explicitly discussed herein.

Control circuit 150 may activate or otherwise select up to one subtrahend amplifier stage 120 and one minuend amplifier stage 130, collectively referred to herein as a differential amplifier set, to produce the differential output signal VOUT from the single-ended input signal VIN. A differential amplifier set may be selected by control circuit 150 to achieve a particular gain $G_O$=VOUT/VIN. It is to be understood that the term "gain" is used herein to denote amplification through which the amplitude of VOUT is greater than the amplitude of VIN, attenuation through which the amplitude of VOUT is less than the amplitude of VIN and buffering through which the amplitude of VOUT is substantially equal to the amplitude of VIN. Assuming the gain of the subtrahend amplifier stage 120 of the amplifying set is $G_M$ and the gain of the minuend amplifier stage 120 of the amplifying set is $G_P$, VOUT=VOP−VOM=$G_P$·VIN−$G_M$·VIN, i.e., $G_O$=$G_P$−$G_M$. Each amplifier stage 120, 130 may be configured with circuit components by which a gain for that stage is achieved. In certain embodiments of the invention, the gain $G_P$ is approximately unity across all minuend amplifier stages 130 and the gain $G_M$ is a function of 1) which, if any, subtrahend amplifier stage 120 is activated and 2) the circuit configuration imposed on the activated subtrahend amplifier stage 120 by control circuit 150. When so embodied, subtrahend amplifier stages 120 may have components in their respective biasing current paths that achieve a particular gain that differs from other subtrahend amplifier stages 120. Additionally, subtrahend amplifier stages 120 can be connected to other circuitry through configuration switches S1-S6 that can supplement or replace the components in the biasing circuit paths and achieve thereby another amount of gain. As an example, embodiments of the invention may implement such configuration selection so that gain $G_O$ can be varied from +20 dB to −10 dB, although the invention is not so limited. Such functionality is exemplified in the descriptions below.

Certain embodiments of the invention select the amount of gain $G_O$, and thus select the appropriate differential amplifier set, based on signal strength of VIN. Accordingly, embodiments of the present invention may include a signal strength sensor 140 to assess the signal strength of the incoming signal VIN. The present invention is not limited to a particular signal strength sensor 140; example circuitry includes peak detectors, envelope detectors, etc., by which an indication of signal strength VSENSE, e.g., an indication of the amplitude of VIN, can be assessed by a machine, e.g., controller 155.

Figure 2:
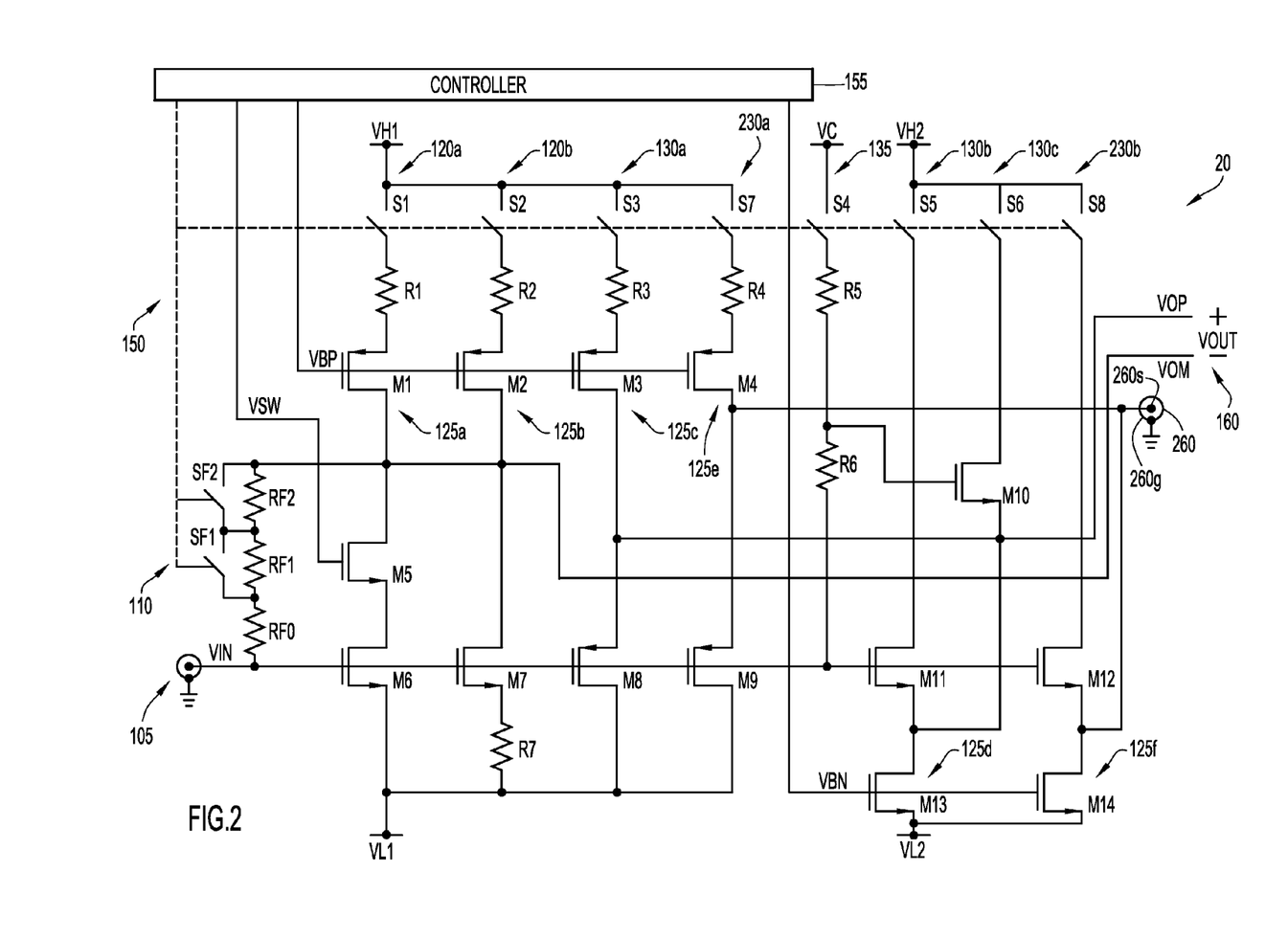
FIG. 2 is a schematic diagram of another variable-gain low-noise amplifier by which the present general inventive concept can be embodied.

FIG. 2 is a schematic diagram of a VG-LNA 20 by which the present invention can be embodied. Exemplary VG-LNA 20 is equivalent to VG-LNA 10 illustrated in FIG. 1 with the exception of additional amplifier stages 230a-230b, representatively referred to as loop-through amplifier stage(s) 230, which provide loop-through functionality for embodiments of the invention (sensor 140 has been omitted to limit congestion in the figure). When so embodied, VG-LNA 20 produces not only a differential output signal VOUT at output port 160, but also a single-ended output signal, referred to herein as a loop-through output signal LTO, between a signal terminal 260s and a common terminal 260g of output port 260. As illustrated in FIG. 2, loop-through amplifier stages 230 are configured as source follower stages having current sources 125e-125f in their respective biasing current paths. Thus, loop-through output signal LTO is a buffered copy of the input signal VIN. Control circuit 150 of VG-LNA 20 includes configuration switches S7-S8 to select one of loop-through amplifier stages 230 depending on the range of voltage required to produce the buffered copy of VIN. As illustrated in FIG. 2, current source 125e incorporates a resistor R4 whereas current source 125f includes no such resistor. Thus, loop-through amplifier stage 230b has a greater dynamic range than loop-through amplifier stage 230a. It is to be noted that the same difference in current source topology exists in current sources 125c and 125d and, accordingly, minuend amplifier stages 130 can also be selected based on the range of voltage required to buffer VIN. In certain embodiments, minuend amplifier stages 130 and loop-through amplifier stages 230 are selected in tandem; minuend amplifier stage 130a and loop-through amplifier stage 230a are activated together, and minuend amplifier stages 130b/130c (both including current source 125d) and loop-through amplifier stage 230b are activated together.

Certain embodiments of the invention define different operational modes that configure VG-LNA 20 (or VG-LNA 10) to achieve an amount of gain $G_O$. For example, VG-LNA 20 may be selectively configured by control circuit 150 into a high high-gain (HHG) mode, a low high-gain (LHG) mode, a high low-gain (HLG) mode and a low low-gain (LLG) mode. To that end, configuration switches S1-S3 and S5-S8 and cutoff switch M5 are electrically interposed in the biasing circuit paths of amplifier stages 120 and 130 and configuration switch S4 is electrically interposed in resistor circuit 135. Controller 155 may generate a command signal in a particular state across a plurality of signal conductors to compel switches S1-S8, SF1-SF2 and cutoff switch M5 into respective conducting (closed) or non-conducting (open) states to configure VG-LNA 20 in one of these operational modes.

FIGS. 3A-3D, collectively referred to herein as FIG. 3, are schematic diagrams demonstrating HHG, LHG, HLG and LLG operational modes, into which a VG-LNA embodying the present invention can be compelled by a suitable control circuit, such as control circuit 150. FIG. 3 represents VG-LNA 20 illustrated in FIG. 2, although the descriptions below are equally pertinent to VG-LNA 10 illustrated in FIG. 1 when discussions of the loop-through path are ignored. For purposes of limiting congestion in the drawing, various features have been omitted from FIG. 3, such as controller 155, voltage sensor 140 and various control signal conductors, although reference to such components and signal paths may be made in the descriptions that follow.

Figure 3A:
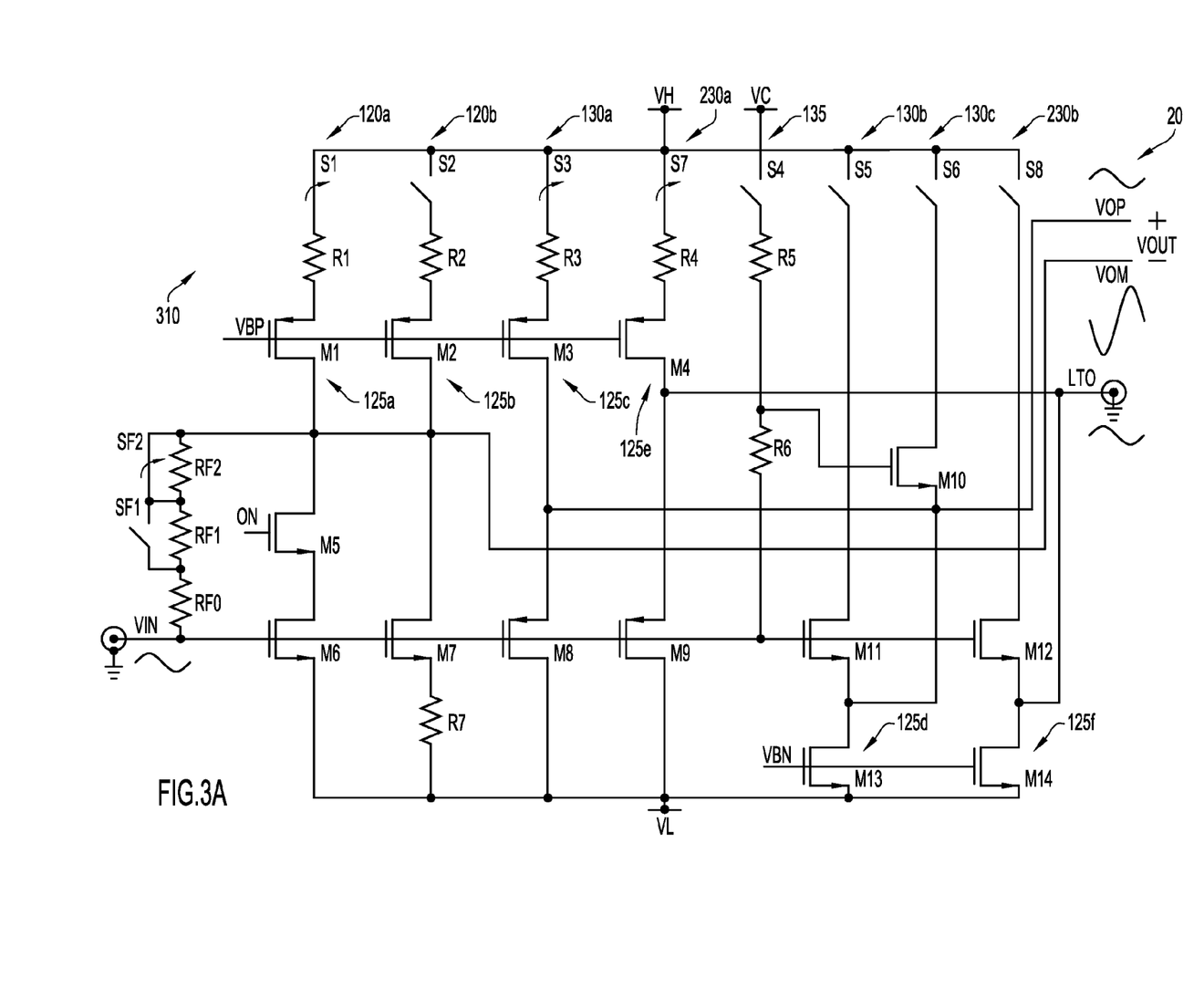
FIGS. 3A-3D are schematic diagrams of the variable-gain low-noise amplifier illustrated in FIG. 2 in high high-gain, low high-gain, high low-gain and low low-gain mode operational modes, respectively.

FIG. 3A is a schematic diagram of VG-LNA 20 in the HHG operational mode, which may be selected when control circuit 150 determines a relatively weak input signal VIN. Accordingly, control circuit 150 may set switches S1, S3 and S7 into conducting states, as well as cutoff switch M5 and feedback resistance selection switch SF2. All other switches are set to non-conducting states. Bias gate voltage VBP is set to establish biasing currents for transistors M6, M8 and M9 in view of respective load resistors R1, R3 and R4. Bias gate voltage VBN is not needed in the HHG operational mode, but may be active nonetheless. In the illustrated HHG configuration, subtrahend amplifier stage 120a is configured as a shunt-feedback common-source amplifier and minuend amplifier stage 130a is configured as source follower. Amplifier stages 120a and 130a form the differential amplifier set and loop-through stage 230a is activated to provide the loop-through output signal LTO. The gain $G_M$ of amplifier stage 120a in HHG configuration 310 is a function of the transconductance $g_{m6}$ of transistor M6 and the parallel resistance of the feedback resistance RF=RF0+RF1, the load resistance of current source 125a and the drain resistance of transistor M6 that accounts for channel length modulation in M6. These parameters are set to configure amplifier stage 120a with the highest gain setting of all other stages in VG-LNA 20. The gain $G_P$ of amplifier stages 130a and 230a, as those skilled in amplifier design will appreciate, is approximately unity. Accordingly, while the single-ended loop-through output signal LTO is approximately identical to the input signal VIN, the differential output signal VOUT is approximately VOUT=VOP−VOM=VIN−GCS·VIN=(1−GCS)·VIN. And, since the gain $G_M$ of a common source amplifier is negative, the difference VOP−VOM combines constructively such that $G_O$ is greater than either of $G_P$ or $G_M$.

It is to be noted that with switch S1 in its conducting state and the drains of transistors M1 and M7 short-circuited, biasing current is available at transistor M7. Resistor R7 may provide suitable resistance to prevent M7 from becoming activated given the absence of such resistance at the source of M6.

Figure 3B:
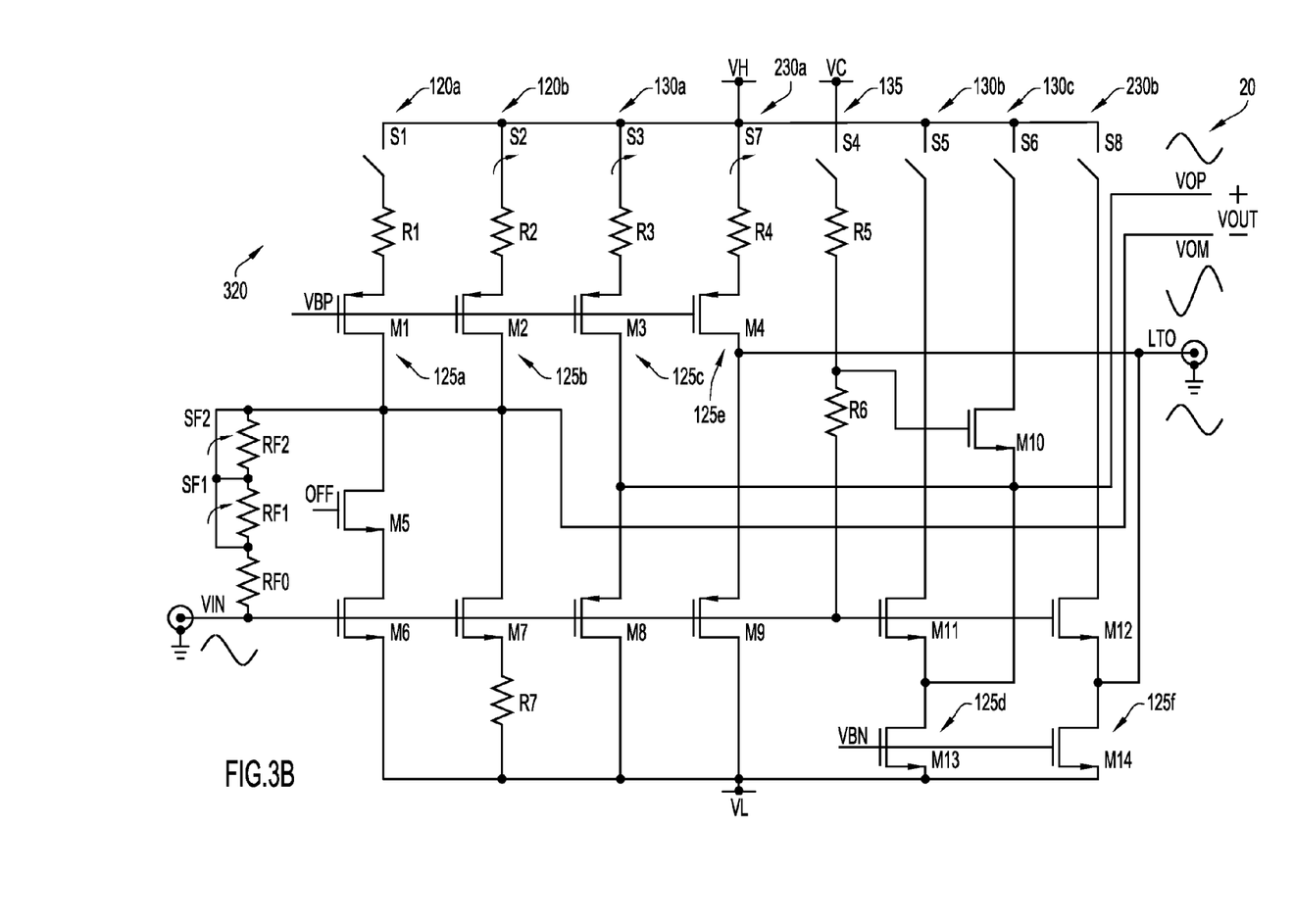

FIG. 3B is a schematic diagram of VG-LNA 20 in its LHG operational mode 320. Control circuit 150 may establish the LHG configuration by setting switches S2, S3, S7 and SF1-SF2 into their respective conducting states and setting all other switches into their non-conducting states. It is to be noted that cutoff switch M5 is set into its non-conducting state to prevent amplifier stage 120a from drawing biasing current from current source 125b thus forcing transistor M6 into an inactive state. The activated source follower stages 130a and 230a that provide output signal component VOP and loop-through output signal LTO are the same stages activated for the HHG mode. The difference in gain between HHG and LHG modes is achieved by the differences between subtrahend amplifier stages 120a and 120b as well as the difference in feedback resistance RF. As illustrated in FIG. 3B, amplifier stage 120b incorporates source resistor R7 which reduces the gain of amplifier stage 120b over an otherwise like-constructed amplifier stage 120a. Feedback resistance RF is also reduced in the LHG mode relative to the HHG mode by an amount equal to the resistance of RF1.

Figure 3C:
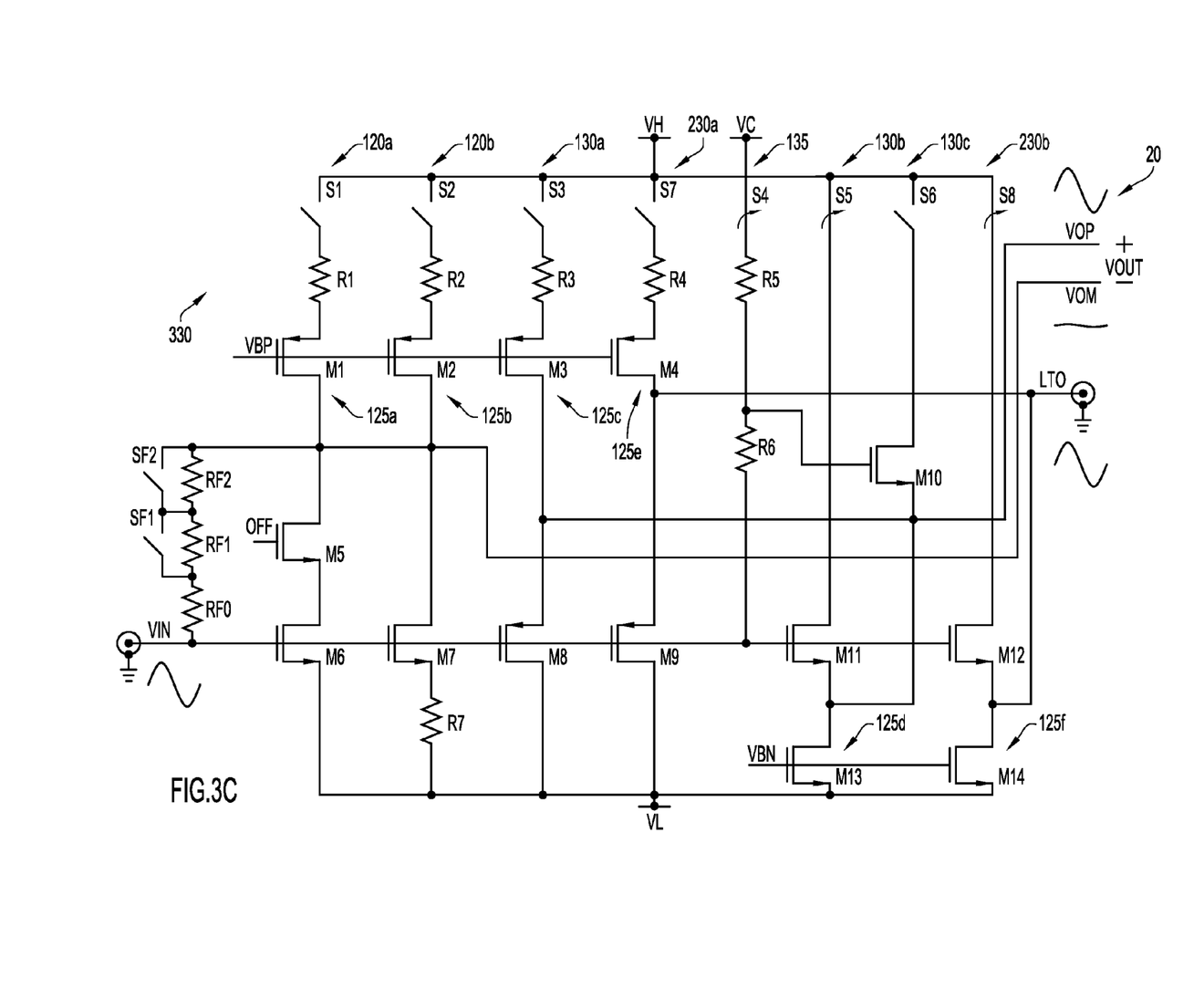

FIG. 3C is a schematic diagram of VG-LNA 20 in its HLG operational mode 330. Control circuit 150 may establish the HLG configuration by setting switches S4, S5 and S8 into their respective conducting states and setting all other switches into their non-conducting states. Consequently, all of current sources 125a-125c and 125e are deactivated and resistance RF is set to its maximum. Under these conditions, transistor M7 is forced into cutoff mode thus deactivating subtrahend amplifier stage 120b (subtrahend amplifier stage 120a remains deactivated by open-circuited cutoff switch M5). With both subtrahend amplifier stages 120 deactivated, VOM is the input signal VIN attenuated by resistance RF. Accordingly, when resistance RF is large enough to prohibit input signal VIN from traversing feedback circuit 110, output signal component VOM is correspondingly small, e.g., approximately zero (0) volts. Meanwhile, VOP is provided by n-channel source follower stage 130b and loop-through output signal LTO is provided by source follower loop-through stage 230b. Each of these source follower stages has approximately unit gain, as did the source follower stages 130a and 230a, but the omission of resistors R3 and R4, respectively, allows greater voltage swing in VOP. Accordingly, the difference VOUT=(VOP−VOM)≈(VIN−0)=VIN.

Those skilled in the art will recognize that with both transistors M6 and M7 in cutoff mode, the input impedance of VG-LNA 20 is no longer a function of closed-loop negative feedback as is the case when either of transistors M6 or M7 is in saturation mode. As mentioned above, constraints on resistance RF for purposes of input impedance matching, such as to match the characteristic impedance of a transmission line, e.g., 75Ω, coupled to input port 105, may demand a quite large resistance value for RF and it is only through negative feedback that the input impedance matching is achieved. Consequently, when both transistors M6 and M7 are in cutoff mode, negative feedback cannot be attained and the input impedance of VG-LNA 20 is impacted accordingly. In certain embodiments, the resistance of resistor circuit 135 is selected to realize a small-signal shunt resistance equal to the desired input impedance, e.g., 75Ω. When so embodied, the input impedance of VG-LNA 20 is the closed-loop input impedance of either of activated minuend amplifier stages 120, in which case switch S4 is operated into its non-conducting state, or is the shunt resistance of resistor circuit 135 when both minuend amplifier stages 120 are deactivated by operating switch S4 into its conducting state.

Figure 3D:
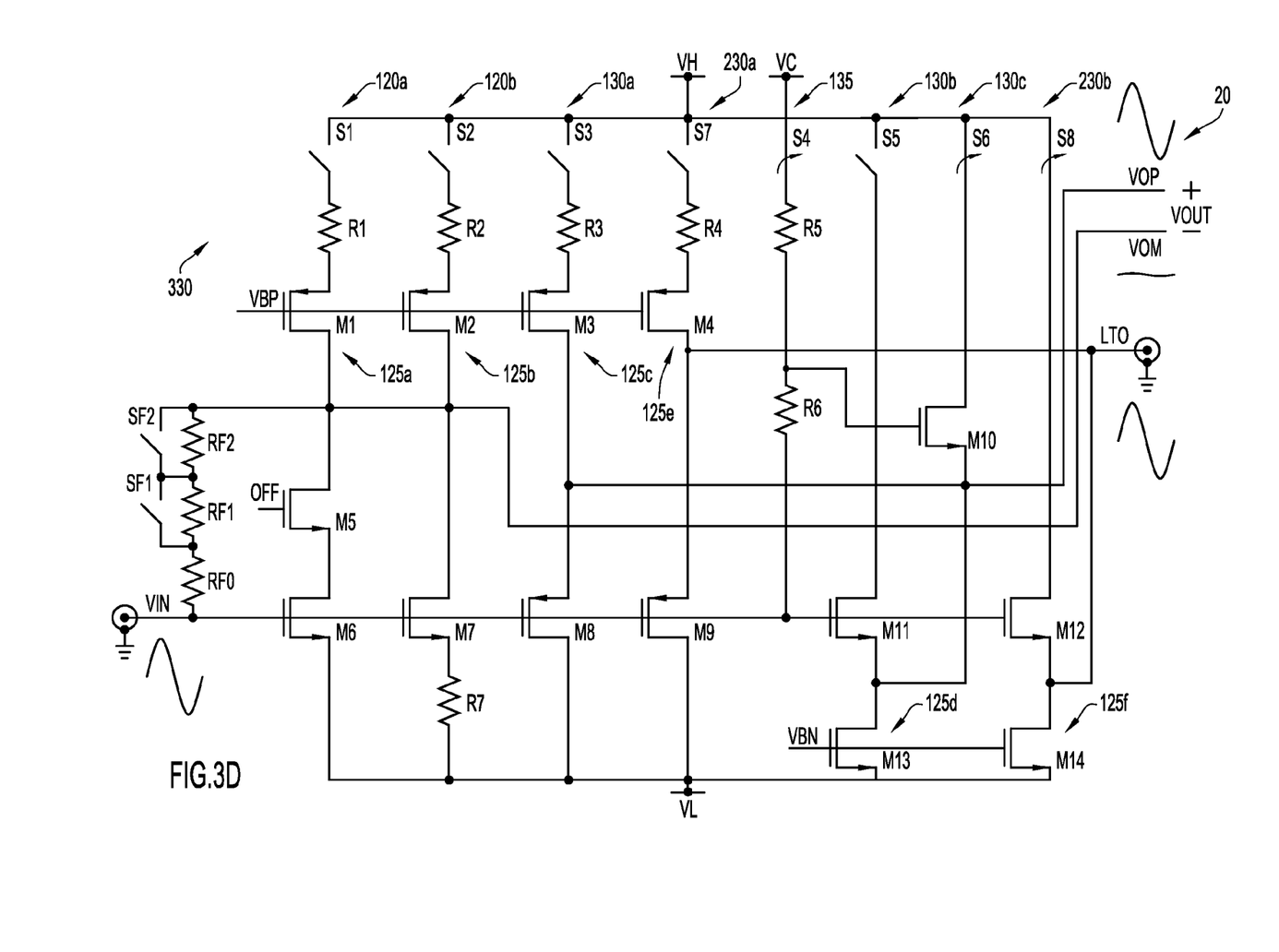

FIG. 3D is a schematic diagram of VG-LNA 20 in its LLG operational mode 340. Control circuit 150 may establish the LLG configuration by setting switches S4, S6 and S8 into their respective conducting states and setting all other switches into their non-conducting states. Accordingly, amplifier stages 120 are deactivated as when VG-LNA 20 is in its HLG operational mode 330. Loop-through signal LTO is provided by source follower loop-through stage 230b as is also the case in the HLG mode 330. However, output signal component VOP is provided by minuend amplifier stage 130c, which obtains its input signal from a circuit node interposed between resistors R5 and R6 in resistor circuit 135. Accordingly, VIN is attenuated at the input of minuend amplifier stage 130c and with the gain of amplifier stage 130c being approximately unity, the attenuated VIN is buffered at output port 160 as signal component VOP. Once again, output signal component VOM is approximately 0V and the difference VOUT=VOP−VOM=VIN.

Figure 4:
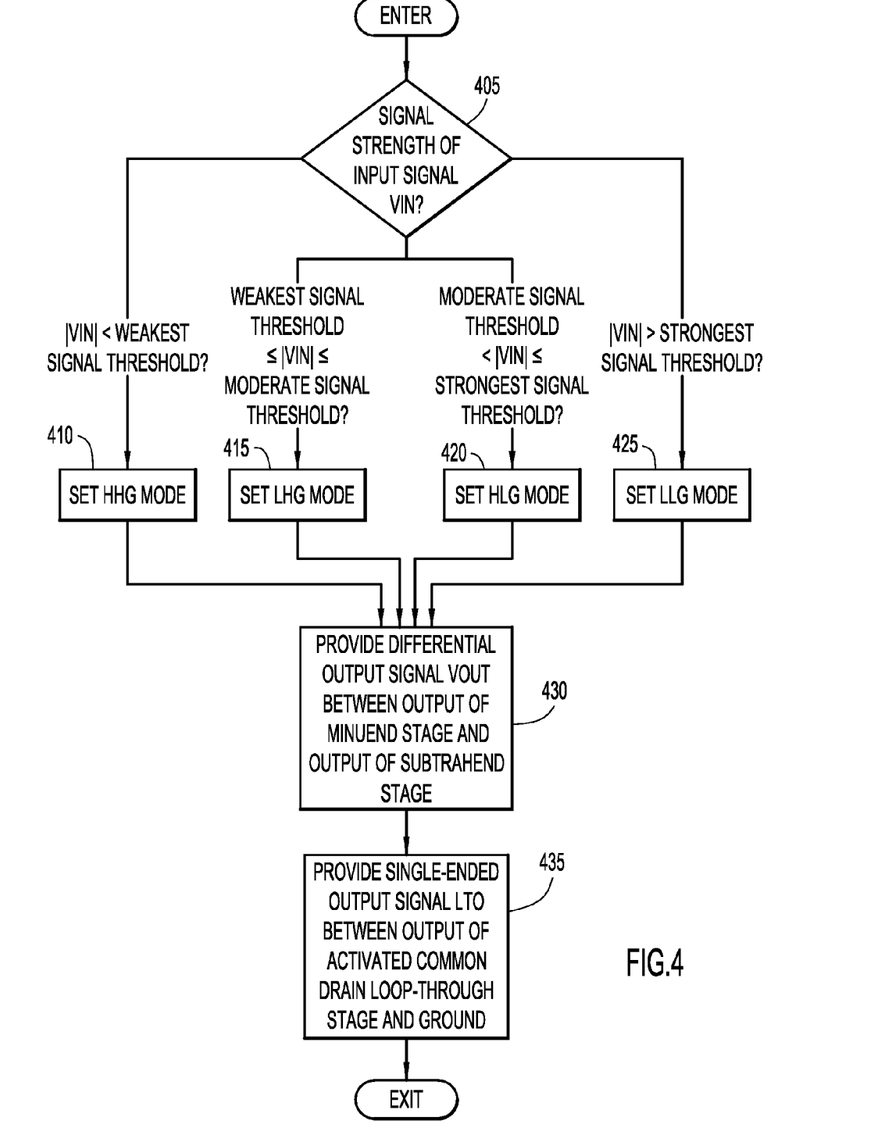
FIG. 4 is a flow diagram of an amplification process by which the present general inventive concept can be embodied.

FIG. 4 is a flow diagram of an exemplary amplification process 400 by which the present invention may be embodied. In operation 405, the signal strength of VIN is determined such as by voltage sensor 140. Voltage sensor 140 may be constructed to generate an electric signal that is indicative of the amplitude of the incoming signal VIN, which can be compared to various threshold values by, for example, controller 155. The amplitude of VIN may be compared with a set of thresholds set at signal strength values from weakest to strongest, e.g., weakest signal strength threshold<moderate signal strength threshold<strongest signal strength threshold, where each threshold defines a boundary for which an operational mode is acceptable for the amplitude of VIN. Thus, when |VIN|<weakest signal strength threshold, control circuit 150 may compel a VG-LNA embodying the present invention, e.g., VG-LNA 10 or 20, into its HHG mode 310, as illustrated in operation 410. If, in operation 405, it is determined that weakest signal strength threshold≤|VIN|≤moderate signal strength threshold, indicating a stronger signal, control circuit 150 may compel VG-LNA 20 into its LHG mode 320, as illustrated in operation 415. If, in operation 405, it is determined that moderate signal strength threshold<|VIN|≤strongest signal strength threshold, indicating an even stronger signal, amplification process 400 may transition to operation 420, where control circuit 150 compels VG-LNA 20 into HLG mode 330. If, in operation 405, it is determined that |VIN|>strongest signal strength threshold, amplification process 400 may transition to operation 425, where control circuit 150 compels VG-LNA 20 into LLG mode 340. Once the VG-LNA is properly configured, process 400 transitions to operation 430, whereby VIN is processed, i.e., amplified, buffered or attenuated by the activated differential amplifier set and the differential output signal VOUT=VOP−VOM is provided at output port 160. In operation 435, single-ended loop-through signal LTO may be provided by the activated loop-through amplifier stage at loop-through output port 260. It is to be understood that amplification process 400 may be repeated continuously to dynamically adapt the applied gain to changing signal strength of the incoming signal VIN.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions may be encoded and then subsequently retrieved, decoded and executed by a processor, including electrical, magnetic and optical storage devices. Examples of non-transitory computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present general inventive concept as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An amplifier comprising:
an input port comprising a signal terminal and a common terminal between which a radio-frequency (RF) single-ended input signal is accepted;
an output port comprising a positive terminal and a negative terminal between which an RF differential output signal is provided;
a plurality of amplifier stages commonly coupled to the signal terminal of the input port, the amplifier stages including a plurality of subtrahend amplifier stages commonly coupled to the negative terminal of the output port and a plurality of minuend amplifier stages commonly coupled to the positive terminal of the output port; and
a control circuit electrically connected to the amplifier stages to activate up to one of the subtrahend amplifier stages and one of the minuend amplifier stages to form a differential set of amplifier stages that generates the differential output signal from the single-ended input signal.

2. The amplifier of claim 1, further comprising:
a feedback circuit electrically connected to the negative terminal of the output port and to the signal terminal of the input port, the feedback circuit having a variably-resistive feedback path.

3. The amplifier of claim 2, wherein the control circuit comprises:
a plurality of switching circuits electrically interposed in respective biasing current paths of the amplifier stages that terminate at supply voltage rails, each switching circuit being operable into one of a conducting state and a non-conducting state; and
a controller to generate a command signal that compels the switching circuits into the respective conducting or non-conducting states in accordance with an amount of gain that is applied to the input signal.

4. The amplifier of claim 3, further comprising:
a plurality of current sources electrically interposed in the respective biasing current paths of the amplifier stages in series with the respective switching circuits; and
a resistor circuit between one of the supply voltage rails and the signal terminal of the input port, the resistor circuit being selectively connected to the voltage supply rail through one of the switching circuits.

5. The amplifier of claim 4, further comprising:
transistors in the respective biasing paths of the subtrahend amplifier stages, the drain terminals of the transistors being commonly coupled to one end of the feedback circuit and the gate terminals of the transistors being commonly coupled to the other end of the feedback circuit such that, in response to the command signal, the transistors form shunt-feedback common source amplifiers, respective gains of which being determined at least in part by a selected resistance in the feedback circuit; and
resistors in the biasing paths of the subtrahend amplifier stages such that the respective gains differ relative one to another for any selected resistance in the feedback circuit.

6. The amplifier of claim 5, further comprising:
transistors in the respective biasing paths of the minuend amplifier stages to form source follower amplifiers.

7. The amplifier of claim 6, wherein the controller compares signal strength of the input signal to a set of signal strength thresholds set at predetermined levels of signal strength, the controller generating the command signal to establish the amount of gain applied to the input signal in response to the comparison.

8. The amplifier of claim 7, wherein, in response to the input signal strength being below one signal strength threshold, the controller generates the command signal that compels the switching circuits to close the biasing current path through the current source in the subtrahend amplifier stage having the highest of the differing gains.

9. The amplifier of claim 8, wherein, in response to the input signal strength exceeding another signal strength threshold, the controller generates the command signal to open the biasing current paths through the current sources in the subtrahend amplifier stages and to connect the resistor circuit to the voltage supply rail.

10. The amplifier of claim 9, wherein in response to the input signal strength exceeding a third signal strength threshold condition, the controller generates the command signal to further close the biasing current path in one of the source follower stages having an input signal path that attenuates the input signal.

11. The amplifier of claim 10, wherein the input signal path that attenuates the input signal includes a node between resistors in the resistor circuit.

12. The amplifier of claim 1, further comprising:
a loop-through port comprising a signal terminal and a common terminal between which an RF single-ended loop-through signal is provided; and
a plurality of loop-through amplifier stages commonly coupled to the signal terminal of the input port and to the signal terminal of the loop-through port and configured to buffer the input signal as the loop-through signal.

13. The amplifier of claim 12, wherein the control circuit activates one of the loop-through amplifier stages concurrently with activating the minuend amplifier stage of the differential set of amplifier stages.

14. A method comprising:
determining signal strength of a radio-frequency (RF) single-ended input signal accepted between a signal terminal and a common terminal of an input port to an amplifier;
activating a differential amplifier set that provides an amount of gain to the input signal in accordance with the input signal strength, the activated differential amplifier set including up to one of a plurality of subtrahend amplifier stages commonly connected to a minus terminal of an output port and one of a plurality of minuend amplifier stages commonly connected to a positive terminal of the output port; and
providing a differential signal component from the minuend amplifier stage of the activated differential set to the positive terminal of the output port and another differential signal component from the subtrahend amplifier stage of the activated differential amplifier set to a negative terminal of the output port so that an RF differential output signal is provided between the positive terminal and the negative terminal of the output port.

15. The method of claim 14, further comprising:
determining the amount of gain from a comparison between the input signal strength and a set of signal strength thresholds being set at predetermined levels of signal strength from weakest to strongest.

16. The method of claim 15, wherein generating the command signal further comprises:
generating the command signal, in response to the input signal strength being below the weakest signal strength threshold, to activate the differential amplifier set that comprises one of the subtrahend amplifier stages configured as a shunt-feedback common source amplifier and having the highest of differing gains among the subtrahend amplifier stages and to select one of the minuend amplifier stages configured as a source follower amplifier.

17. The method of claim 16, wherein generating the command signal further comprises:
generating the command signal, in response to the input signal strength exceeding the weakest signal strength threshold while being below a moderate signal strength threshold, to activate the differential amplifier set that comprises another one of the subtrahend amplifier stages configured as another shunt-feedback common source amplifier and having one of the differing gains that is less than the highest of differing gains, and to select the minuend amplifier stage configured as the source follower amplifier.

18. The method of claim 17, wherein generating the command signal further comprises:
generating the command signal, in response to the input signal strength exceeding the moderate signal strength threshold while being below the strongest signal strength threshold, to activate the differential amplifier set that comprises no activated subtrahend amplifier stage and another one of the minuend amplifier stages configured as another source follower amplifier having a greater signal range than the source follower amplifier.

19. The method of claim 18, wherein generating the command signal further comprises:
generating the command signal, in response to the input signal strength exceeding the strongest signal strength threshold, to activate the differential amplifier set that comprises no subtrahend amplifier stage and a third one of the minuend amplifier stages configured as a third source follower amplifier having an input signal path that attenuates the input signal.

20. The method of claim 14, wherein generating the command signal further comprises:
generating the command signal to activate a loop-through amplifier stage from a plurality of loop-through amplifier stages commonly coupled to a signal terminal of a loop-through port; and
providing an RF single-ended loop-through signal from the activated loop-through amplifier stage between the signal terminal and a common terminal of the loop-through port.

* * * * *